(12) United States Patent
Wu et al.

(10) Patent No.: US 9,568,553 B2
(45) Date of Patent: Feb. 14, 2017

(54) METHOD OF INTEGRATED CIRCUIT SCAN CLOCK DOMAIN ALLOCATION AND MACHINE READABLE MEDIA THEREOF

(71) Applicant: Realtek Semiconductor Corp., HsinChu (TW)

(72) Inventors: Ming-Chung Wu, Yilan County (TW); Shuo-Fen Kuo, Hsinchu County (TW); Ying-Yen Chen, Chiayi County (TW); Jih-Nung Lee, Hsinchu County (TW); Ching-Feng Su, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 764 days.

(21) Appl. No.: 14/027,247

(22) Filed: Sep. 16, 2013

(65) Prior Publication Data

US 2014/0091812 A1 Apr. 3, 2014

(30) Foreign Application Priority Data

Oct. 2, 2012 (TW) .............................. 101136348 A

(51) Int. Cl.
  *G06F 17/50* (2006.01)
  *G01R 31/3193* (2006.01)
  *G01R 31/3185* (2006.01)

(52) U.S. Cl.
  CPC . *G01R 31/31937* (2013.01); *G01R 31/318583* (2013.01); *G06F 17/5045* (2013.01); *G06F 17/505* (2013.01); *G06F 17/5022* (2013.01); *G06F 2217/14* (2013.01)

(58) Field of Classification Search
  CPC . G06F 17/505; G06F 17/5022; G06F 17/5045

USPC .......... 716/100–101, 103–104, 136; 714/726
See application file for complete search history.

(56) References Cited

U.S. PATENT DOCUMENTS

| 2007/0255988 | A1* | 11/2007 | Wang | G01R 31/31704 714/726 |
| 2008/0141086 | A1* | 6/2008 | Huang | G01B 31/31859 714/726 |
| 2009/0125771 | A1 | 5/2009 | Duggal | |
| 2009/0132880 | A1* | 5/2009 | Wang | G01R 31/31704 714/731 |
| 2010/0218060 | A1* | 8/2010 | Nakako | G01R 31/31854 714/729 |
| 2014/0075257 | A1* | 3/2014 | Wang | G06F 17/5045 714/731 |

(Continued)

FOREIGN PATENT DOCUMENTS

| TW | 200919246 | 5/2009 |
| TW | 201129893 | 9/2011 |
| TW | 201206086 | 2/2012 |

*Primary Examiner* — Stacy Whitmore
(74) *Attorney, Agent, or Firm* — Winston Hsu; Scott Margo

(57) ABSTRACT

A method for deciding a scan clock domain allocation of an integrated circuit includes: utilizing a circuit netlist file and a timing constraints file of the integrated circuit to find out the amount of crossing paths between any two function clock domains of a plurality of function clock domains, and generate a clock domain report file; and grouping the plurality of function clock domains and allocating the plurality of function clock domains after being grouped into a plurality of scan clock domains according to the clock domain report file.

13 Claims, 8 Drawing Sheets

(56) References Cited

U.S. PATENT DOCUMENTS

| | | | | |
|---|---|---|---|---|
| 2014/0223251 A1* | 8/2014 | Wang | ............... | G06F 17/5045 714/731 |
| 2015/0316616 A1* | 11/2015 | Wang | ............... | G06F 17/5045 714/729 |
| 2015/0338465 A1* | 11/2015 | Wang | ............... | G06F 17/5045 714/731 |
| 2016/0131707 A1* | 5/2016 | Wang | ............... | G06F 17/5045 714/731 |

\* cited by examiner

METHOD OF INTEGRATED CIRCUIT SCAN CLOCK DOMAIN ALLOCATION AND MACHINE READABLE MEDIA THEREOF

BACKGROUND OF THE INVENTION

1. Field of the Invention

The disclosed embodiments of the present invention relate to a method of scan clock domain allocation and related machine readable media utilizing the method of scan clock domain allocation, and more particularly, to a method for determining the scan clock domain allocation of an integrated circuit and related machine readable media.

2. Description of the Prior Art

A scan test pattern is widely used in an integrated circuit testing flow, wherein the scan test pattern should be used on a testing machine along with a scan clock, and the number of scan clocks is limited to a limited pin number of a chip or a testing machine. Different function clock domains need to be grouped in order to share the same scan clock in a scan test mode; that is, more than one function clock domain would be replaced by the scan clock to become a new scan clock domain. To avoid instantaneous testing power surges, however, more than one scan clock is used and the phases of the scan clocks are staggered. When two function clock domains are asynchronous or have large false paths, grouping the two function clock domains would introduce a large amount of timing violations in scan test mode, resulting in the need to increase area and power consumption in order to fix the timing violations.

Therefore, in a conventional testing flows, scan clock domain allocation usually has to be repeated after the clock tree synthesis, and a preferred result may be obtained after iterative violation fixing several times, or even necessitating a large extra chip area and the use of man power in exchange for a timing solution. This kind of flow and process is time and resource consuming. Thus, there is a need for an innovative design which can group a plurality of function clock domains and allocate the grouped function clock domains into a limited number of scan clock domains efficiently.

SUMMARY OF THE INVENTION

One of the objectives of the present invention is to provide a more efficient method of scan clock domain allocation and a related machine readable media.

According to a first aspect of the present invention, an exemplary method for determining a scan clock domain allocation of an integrated circuit is disclosed. The exemplary method comprises: utilizing a circuit netlist file and a timing constraints file of the integrated circuit to find out the amount of crossing paths between any two function clock domains of a plurality of function clock domains and generate a clock domain report file; and grouping the plurality of function clock domains and allocating the plurality of function clock domains after being grouped into a plurality of scan clock domains according to the clock domain report file; wherein the amount of the plurality of scan clock domains is less than the amount of the plurality of function clock domains.

According to a second aspect of the present invention, an exemplary machine readable media is disclosed. The exemplary machine readable media stores a program code, wherein when executed by a processor, the program code enables the processor to perform the following steps: utilizing a circuit netlist file and a timing constraints file of the integrated circuit to find out the amount of crossing paths between any two function clock domains of a plurality of function clock domains and generate a clock domain report file; and grouping the plurality of function clock domains and allocating the plurality of function clock domains after being grouped into a plurality of scan clock domains according to the clock domain report file; wherein the amount of the plurality of scan clock domains is less than the amount of the plurality of function clock domains.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
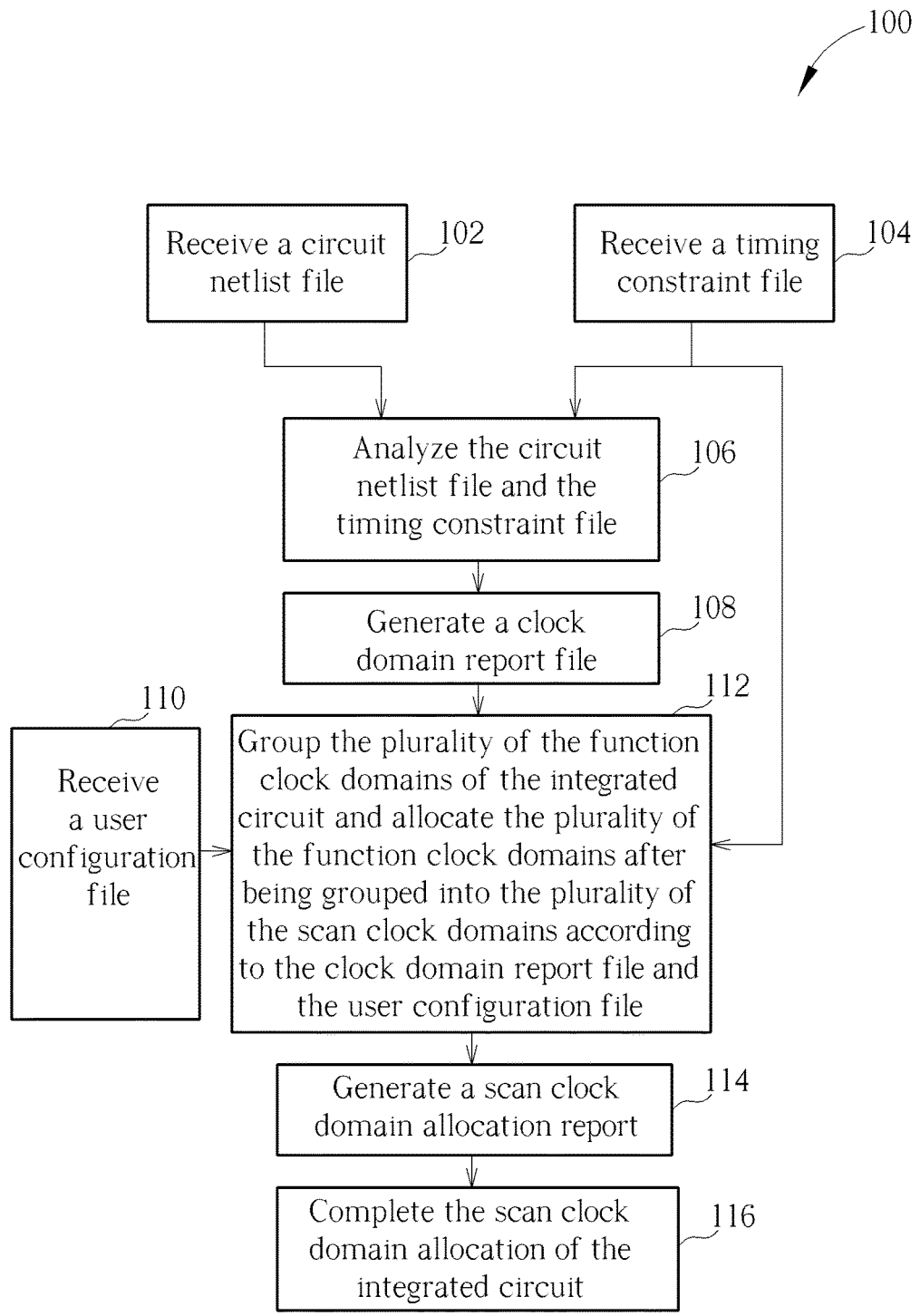
FIG. 1 is a flowchart illustrating an integrated circuit scan clock domain allocation method according to an embodiment of the present invention.

Please refer to FIG. 1, which is a flowchart illustrating an integrated circuit scan clock domain allocation method 100 according to an embodiment of the present invention. In this embodiment, the integrated circuit scan clock domain allocation method 100 may be used for scan clock domain allocation in a circuit netlist file of an integrated circuit to generate a preferred scan clock domain allocation method. Provided that substantially the same result is achieved, the steps in FIG. 1 need not be in the exact order shown and need not be contiguous; that is, other steps can be intermediate. Some steps in FIG. 1 may be omitted according to various types of embodiments or requirements. In this embodiment, the detailed operation of the integrated circuit scan clock domain allocation method 100 may comprise the following steps.

Step 102: Receive a circuit netlist file;
Step 104: Receive a timing constraint file;
Step 106: Analyze the circuit netlist file and the timing constraint file;
Step 108: Generate a clock domain report file;
Step 110: Receive a user configuration file;
Step 112: Group the plurality of the function clock domains of the integrated circuit and allocate the plurality of the function clock domains after being grouped into the plurality of the scan clock domains according to the clock domain report file and the user configuration file;
Step 114: Generate a scan clock domain allocation report; and
Step 116: Complete the scan clock domain allocation of the integrated circuit.

When a circuit designer finishes the synthesizing step of an integrated circuit, a circuit netlist file can be obtained. For instance, the integrated circuit may be a digital circuit with a specific function. One or more than one clock is required to trigger specific circuit components in the digital circuit during the operation of the digital circuit; hence, the circuit designer may provide a timing constraint file of the integrated circuit to depict the timing constraints of the clocks (step 104). In order to perform scan clock domain allocation more precisely upon the circuit netlist file of the integrated circuit to generate a preferred allocation result, the integrated circuit scan clock domain allocation method 100 of the present invention would analyze for the circuit netlist file and the timing constraint file. Via analysis, the integrated circuit scan clock domain allocation method 100 may generate a clock domain report file, wherein the clock domain report file is utilized to record the information of the crossing paths between clock domains of the circuit netlist file (step 108).

In this embodiment, the circuit netlist file includes a plurality of function clock domains, and the timing constraint file may include the information of frequency, phase, and the timing exception paths definitions of the plurality of function clock domains. Utilizing the timing constraint and the circuit netlist file can simulate the real function operations specifically cycle by cycle to examine whether timing violation exists before the chip is manufactured according to the circuit netlist file. The circuit netlist file includes a plurality of flip flops, wherein each flip flop is controlled by a corresponding function clock: each flip flop belongs to one of the plurality of function clock domains, and using the information of the timing constraint file can correlate the plurality of flip flops in the circuit netlist file to the plurality of function clock domains respectively. Therefore, when a path exists between two flip flops and the two flip flops belong to different function clock domains, the path shall be a crossing path. The crossing path can also be divided into a true path or a false path. In step 108, the amount of crossing paths between at least one scan clock domain and another scan clock domain is recorded in the clock domain report file; in addition, the clock domain report file further includes information regarding whether any crossing path belongs to a true path or a false path, or the amount of flip flops in any function clock domain.

In step 112, the clock domain report file is used to allocate the plurality of function clock domains of the integrated circuit to the plurality of the scan clock domain. Due to the amount of the plurality of scan clock domains often being less than the amount of the plurality of function clock domains, one-to-one clock domain conversion from the function mode to the scan mode is difficult to implement. Therefore, the plurality of function clock domains should be partitioned in accordance with the amount of the plurality of scan clock domains and the clock domain report file. According to the integrated circuit scan clock domain allocation method 100 of the present invention, a user configuration file may be further referred to allocate the plurality of function clock domains of the integrated circuit (step 110), wherein the user configuration file includes at least one of settings of a scan clock domain allocation algorithm and settings of the amount of a scan clock domain. The settings of a scan clock domain allocation algorithm are used for further detailed settings and adjustments for the scan clock domain allocation algorithm according to different applications or requests, and the settings of the amount of the scan clock domain is according to the actual state, such as the chip size, the amount of pins, or the automatic testing equipment pin limitation.

After the partitioned circuits are allocated to the plurality of scan clock domains, a scan clock domain allocation report would be generated for the circuit designer's reference in accordance with the integrated circuit scan clock domain allocation method 100 of the present invention (step 114), and the scan clock domain allocation of the integrated circuit is completed at this point.

Figure 2:
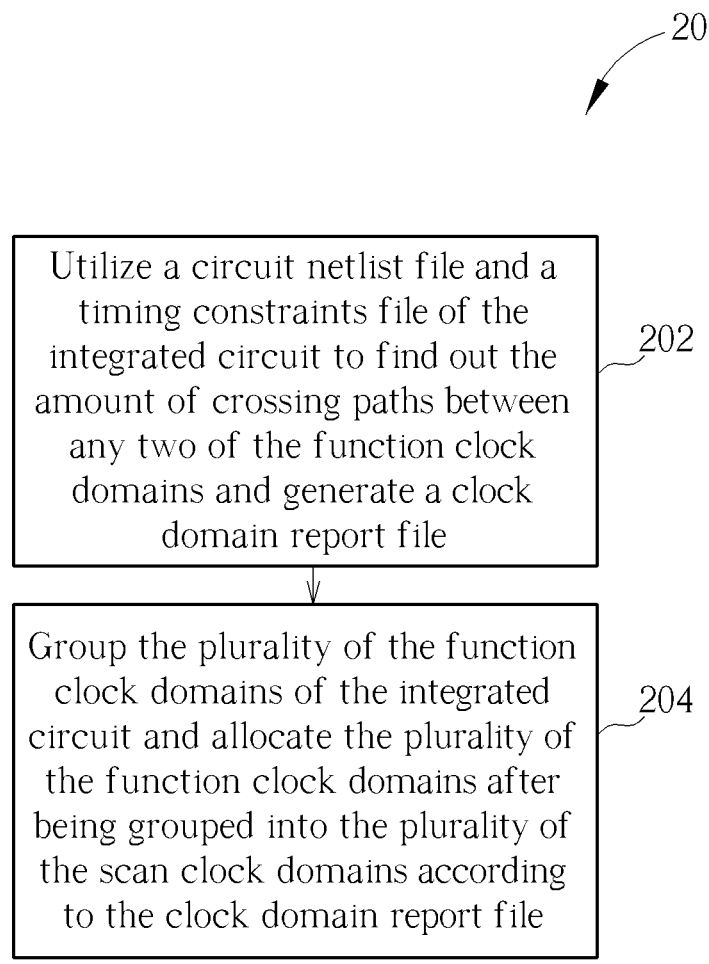
FIG. 2 is a flowchart illustrating an integrated circuit scan clock domain allocation method according to an embodiment of the present invention.

The integrated circuit scan clock domain allocation method 100 of the present invention may be further represented as the steps in FIG. 2, which is a flowchart illustrating an integrated circuit scan clock domain allocation method 200 according to an embodiment of the present invention. Provided that substantially the same result is achieved, the steps in FIG. 2 need not be in the exact order shown and need not be contiguous; that is, other steps can be intermediate. Some steps in FIG. 2 may be omitted according to various types of embodiments or requirements. In this embodiment, the detailed operation of the integrated circuit scan clock domain allocation method 200 may comprise the following steps.

Step 202: Utilize a circuit netlist file and a timing constraints file of the integrated circuit to find out the amount of crossing paths between any two of the function clock domains and generate a clock domain report file; and
Step 204: Group the plurality of the function clock domains of the integrated circuit and allocate the plurality of the function clock domains after being grouped into the plurality of the scan clock domains according to the clock domain report file.

Figure 3:
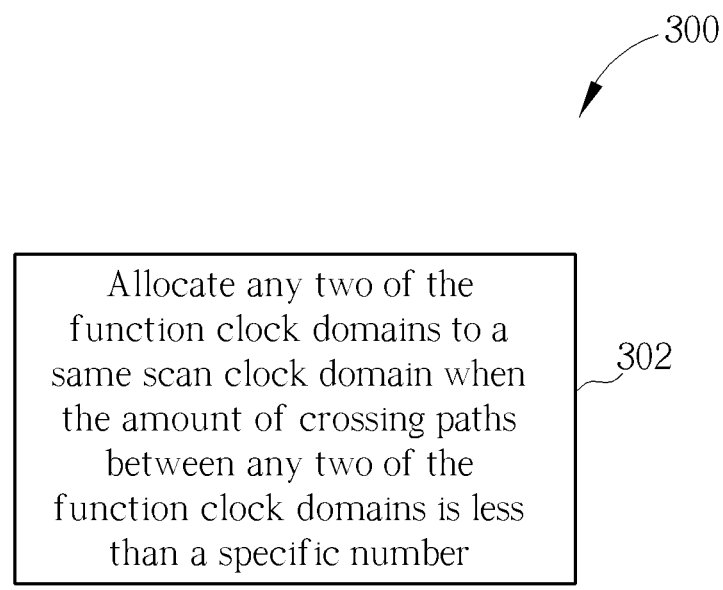
FIG. 3 is a flowchart illustrating a first embodiment of the step of grouping the plurality of the function clock domains of the integrated circuit and allocating the plurality of the function clock domains after being grouped into the plurality of the scan clock domains according to the clock domain report file shown in FIG. 2.

It should be noted that, due to a digital integrated circuit usually being a large and complex circuit, it would be difficult to optimize the scan clock domain allocation of each integrated circuit by one standard. Different methods should be employed to deal with the allocation of scan clock domains of an integrated circuit according to the content of the clock domain report file. The embodiments of the different methods are shown in FIG. 3-FIG. 6. FIG. 3 is a flowchart illustrating a first embodiment 300 of the step of grouping the plurality of the function clock domains of the integrated circuit and allocating the plurality of the function clock domains after being grouped into the plurality of the scan clock domains according to the clock domain report file shown in FIG. 2 (i.e. step 204). In this embodiment, the detailed operation of the first embodiment 300 may comprise the following steps.

Step 302: Allocate any two of the function clock domains to a same scan clock domain when the amount of crossing paths between any two of the function clock domains is less than a specific number.

In step 302, the specific number may be set by a user configuration file. It should be noted that the fewer the amount of crossing paths between two function clock domains which belong to the same scan clock domain, the smaller the difficulty of the clock tree synthesis; moreover, the smaller the chip area and testing power consumption. When there are many crossing paths between two function clock domains which belong to the same scan clock domain (and particularly when most of the crossing paths are false paths), a large amount of timing violations would emerge and result in the need to increase the area during the clock tree synthesis in order to fix the timing violations. The amount of crossing paths may be regarded as a point to determine if two different function clock domains are appropriate to be partitioned into the same scan clock domain.

Figure 4:
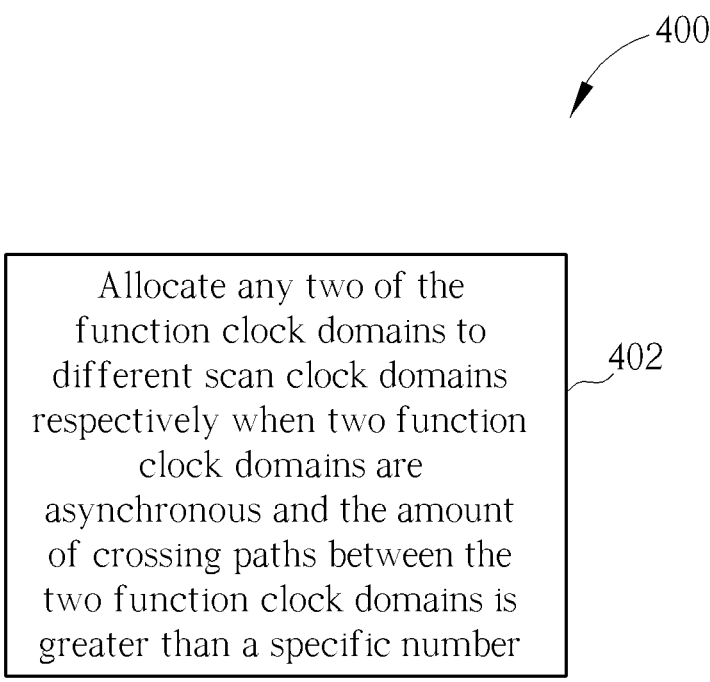
FIG. 4 is a flowchart illustrating a second embodiment of the step of grouping the plurality of the function clock domains of the integrated circuit and allocating the plurality of the function clock domains after being grouped into the plurality of the scan clock domains according to the clock domain report file shown in FIG. 2.

FIG. 4 is a flowchart illustrating a second embodiment 400 of the step of grouping the plurality of function clock domains of the integrated circuit and allocating the plurality of the function clock domains after being grouped into the plurality of scan clock domains according to the clock domain report file shown in FIG. 2 (i.e. step 204). In this embodiment, the detailed operation of the first embodiment 300 may comprise the following steps.

Step 402: Allocate any two of the function clock domains to different scan clock domains respectively when two function clock domains are asynchronous and the amount of crossing paths between the two function clock domains is greater than a specific number.

In step 402, the information of asynchronicity is based on information regarding frequency and phase of the timing constraint file. When two function clock domains are asynchronous, a large portion of the crossing paths between the two function clock domains would be introduced with timing violations, resulting in the need to increase the area during the clock tree synthesis in order to fix the timing violations. Therefore, the greater the number of crossing paths between two asynchronous function clock domains which belong to the same scan clock domain, the larger the required chip area and testing power consumption. Thus, the amount of the crossing paths maybe regarded as a point to determine if asynchronous function clock domains are appropriate to be partitioned into the same scan clock domain.

Figure 5:
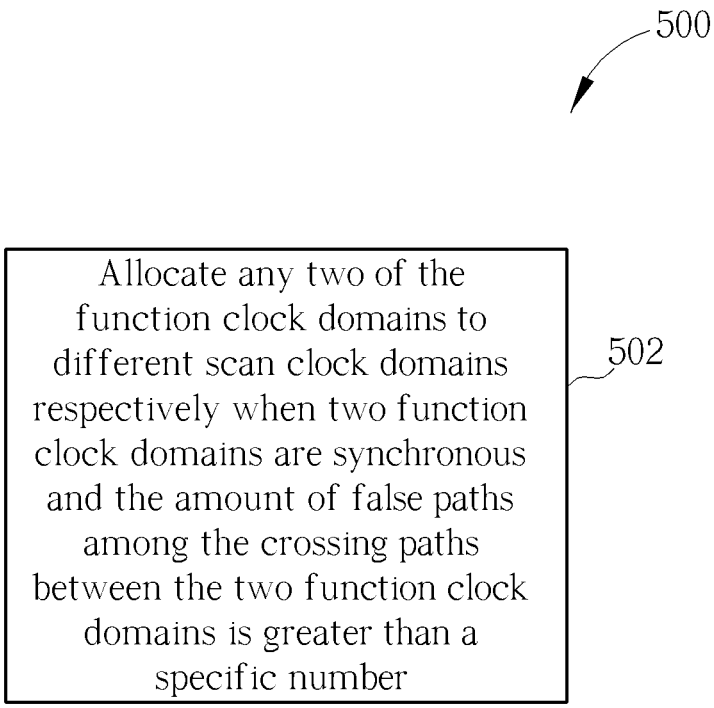
FIG. 5 is a flowchart illustrating a third embodiment of the step of grouping the plurality of the function clock domains of the integrated circuit and allocating the plurality of the function clock domains after being grouped into the plurality of the scan clock domains according to the clock domain report file shown in FIG. 2.

FIG. 5 is a flowchart illustrating a third embodiment 500 of the step of grouping the plurality of the function clock domains of the integrated circuit and allocating the plurality of the function clock domains after being grouped into the plurality of scan clock domains according to the clock domain report file shown in FIG. 2 (i.e. step 204). In this embodiment, the detailed operation of the first embodiment 300 may comprise the following steps.

Step 502: Allocate any two of the function clock domains to different scan clock domains respectively when two function clock domains are synchronous and the amount of false paths among the crossing paths between the two function clock domains is greater than a specific number.

In step 502, when two function clock domains are synchronous and the amount of false paths among the crossing paths between the two o function clock domains is greater than a specific number, the functions of the two function clock domains are not relevant to each other; therefore, a large amount of timing violations would emerge, resulting in the need to increase the area during the clock tree synthesis in order to fix the timing violations.

Figure 6:
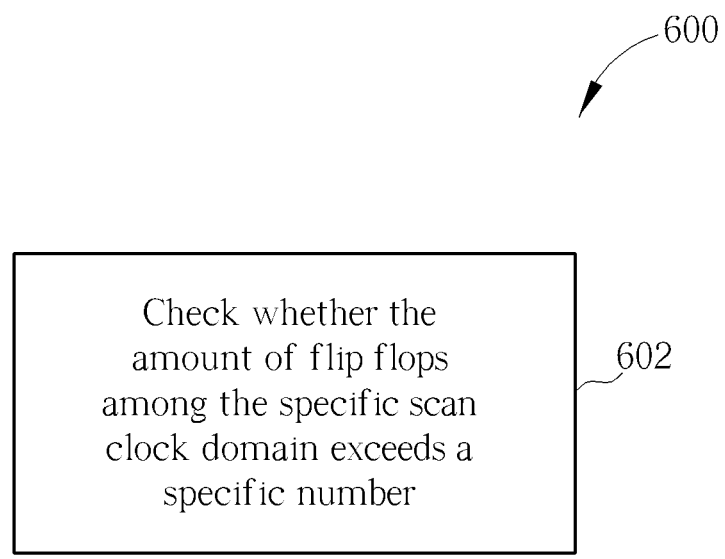
FIG. 6 is a flowchart illustrating a fourth embodiment of the step of grouping the plurality of the function clock domains of the integrated circuit and allocating the plurality of the function clock domains after being grouped into the plurality of the scan clock domains according to the clock domain report file shown in FIG. 2.

FIG. 6 is a flowchart illustrating a fourth embodiment 600 of the step of grouping the plurality of the function clock domains of the integrated circuit and allocating the plurality of the function clock domains after being grouped into the plurality of scan clock domains according to the clock domain report file shown in FIG. 2 (i.e. step 204). In this embodiment, the detailed operation of the first embodiment 600 may comprise the following steps.

Step 602: Check whether the amount of flip flops among the specific scan clock domain exceeds a specific number.

In order to avoid a condition where the amount of flip flops in each of the scan clock domains are not substantially equal thus causing instantaneous testing power surges, the specific number is utilized to limit the amount of flip flops of each scan clock domain in step 602.

Please note that the present invention is not limited to using only one of the methods in FIG. 3-FIG. 6 to allocate scan clock domains in an integrated circuit. In practice, more than one of the methods in FIG. 3-FIG. 6 maybe used to allocate scan clock domains in an integrated circuit simultaneously.

Figure 7:
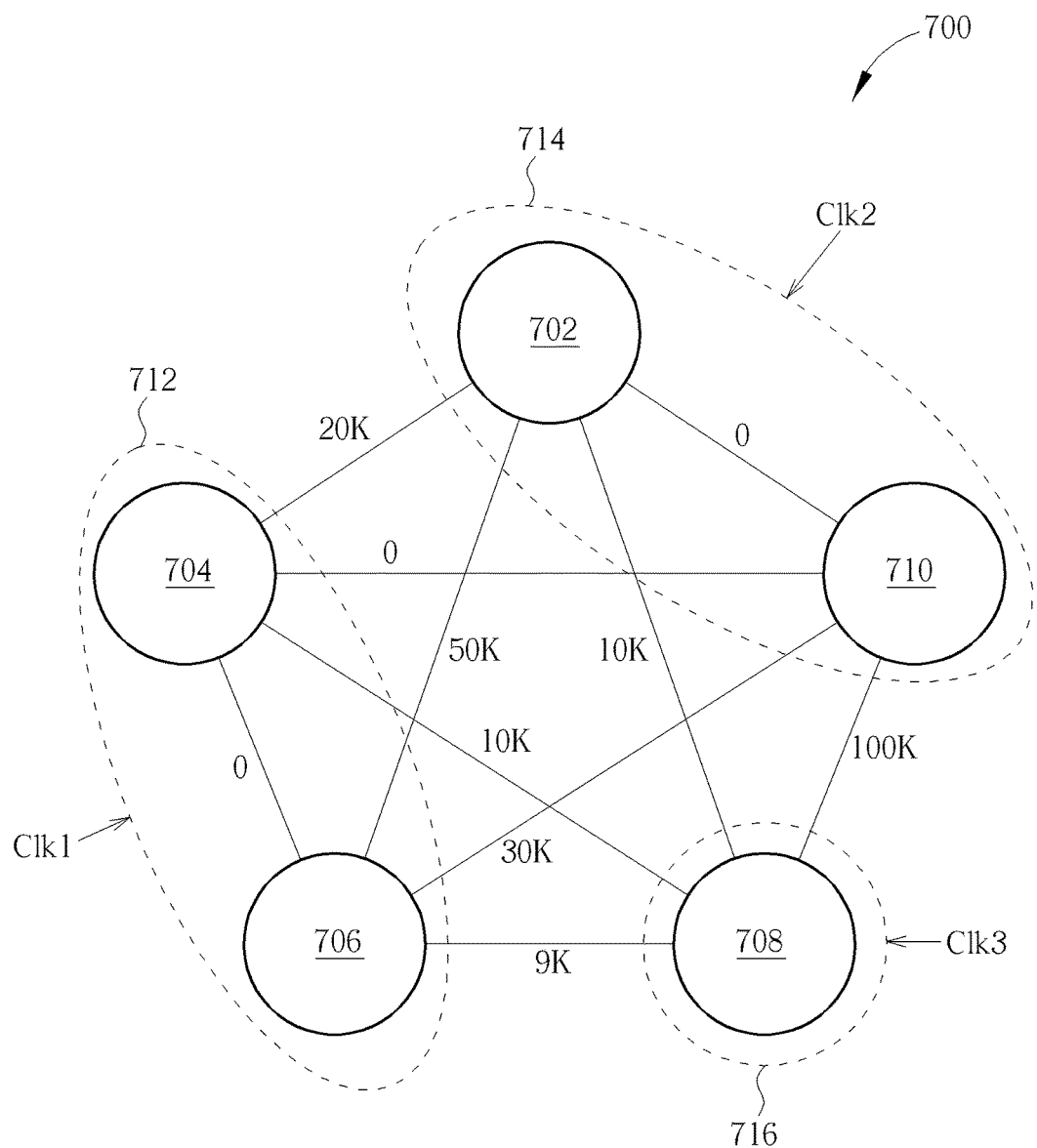
FIG. 7 is a diagram illustrating an embodiment of allocating a circuit netlist file of an integrated circuit according to the integrated circuit scan clock domain allocation method 100 in FIG. 1.

Please refer to FIG. 7, which is a diagram illustrating an embodiment of allocating a circuit netlist file 700 of an integrated circuit according to the integrated circuit scan clock domain allocation method 100 in FIG. 1. In step 112, a plurality of function clock domains included in the circuit netlist file 700 according to the integrated circuit scan clock domain allocation method 100 are: a first function clock domain 702, a second function clock domain 704, a third function clock domain 706, a fourth function clock domain 708, and a fifth function clock domain 710, wherein the first function clock domain 702 has 20 k (i.e. 20,000) flip flops, the second function clock domain 704 has 30 k (i.e. 30,000) flip flops, the third function clock domain 706 has 15 k (i.e. 15,000) flip flops, the fourth function clock domain 708 has 10 k (i.e. 10,000) flip flops, and the fifth function clock domain 710 has 10 k (i.e. 10,000) flip flops. In step 108, the amount of crossing paths between any two of the function clock domains in the integrated circuit can be obtained according to the integrated circuit scan clock domain allocation method 100, wherein there are 20 k (i.e. 20,000) paths between the first function clock domain 702 and the second function clock domain 704, 50 k (i.e. 50,000) paths between the first function clock domain 702 and the third function clock domain 706, 10 k (i.e. 10,000) paths between the first function clock domain 702 and the fourth function clock domain 708, 0 paths between the first function clock domain 702 and the fifth function clock domain 710, 0 paths between the second function clock domain 704 and the third function clock domain 706, 10 k (i.e. 10,000) paths between the second function clock domain 704 and the fourth function clock domain 708, 0 paths between the second function clock domain 704 and the fifth function clock domain 710, 9 k (i.e. 9,000) paths between the third function clock domain 706 and the fourth function clock domain 708, 30 k (i.e. 30,000) paths between the third function clock domain 706 and the fifth function clock domain 710, and 100 k (i.e. 100,000) paths between the fourth function clock domain 708 and the fifth function clock domain 710.

By utilizing the disclosed method according to the embodiments in FIG. 3-FIG. 6, the second function clock domain 704 and the third function clock domain 706 would be allocated to a first scan clock domain 712, which corresponds to a first scan clock clk1, the first function clock domain 702 and the fifth function clock domain 710 would be allocated to a second scan clock domain 714, which corresponds to a second scan clock clk2, and the fourth function clock domain 708 would be allocated to a third scan clock domain 716, which corresponds to a third scan clock clk3, as shown in FIG. 7. In this way, the circuit netlist file 700 of the integrated circuit can use the first scan clock clk1, the second scan clock clk2, and the third scan clock clk3 to trigger the first scan clock domain 712, the second scan clock domain 714, and the third scan clock domain 716 respectively for the verification of the circuit netlist file 700.

Figure 8:
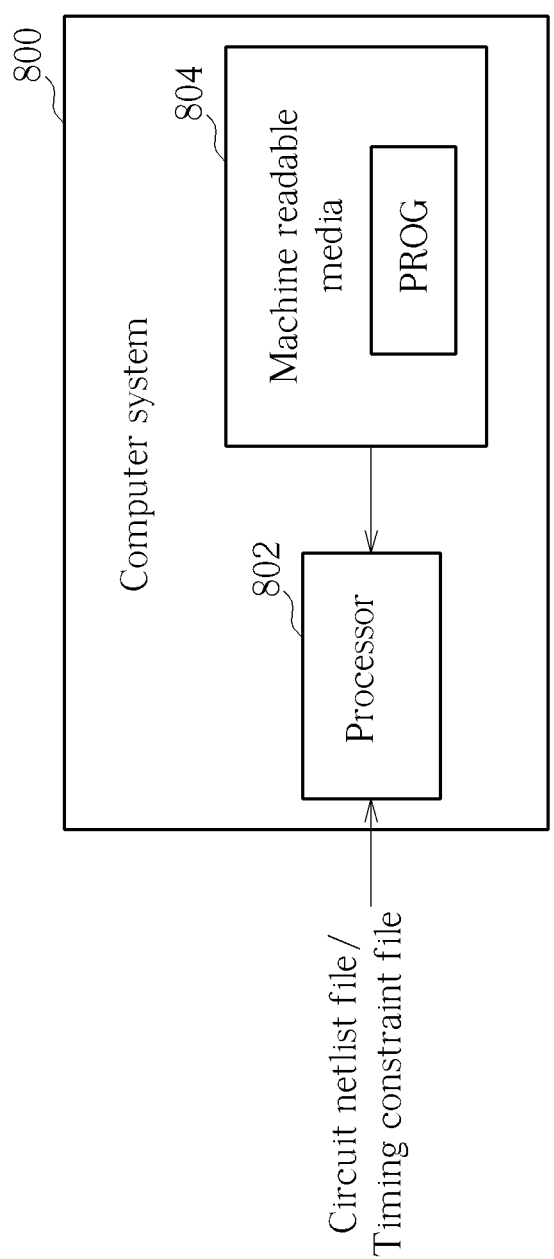
FIG. 8 is a diagram illustrating a computer system for allocating a scan clock domain of an integrated circuit according to an embodiment of the present invention.

Please refer to FIG. 8, which is a diagram illustrating a computer system 800 for allocating scan clock domain of an integrated circuit according to an embodiment of the present invention. The computer system 800 includes a processor 802 and a machine readable media 804. The machine readable media 804 stores a program code PROG, wherein when the code is executed by the processor 802, the program code PROG enables the processor 802 to perform the following steps: utilizing a circuit netlist file and a timing constraints file of the integrated circuit to find out the amount of crossing paths between any two of the function clock domains and generate a clock domain report file; and grouping the plurality of the function clock domains and allocating the plurality of the function clock domains after being grouped into the plurality of the scan clock domains according to the clock domain report file; wherein the amount of the plurality of scan clock domains is less than the amount of the plurality of the function clock domains. Moreover, the step of grouping the plurality of the function clock domains and allocating the plurality of the function clock domains after being grouped into the plurality of the scan clock domains includes: receiving a user configuration file; and grouping the plurality of the function clock domains of the integrated circuit and allocating the plurality of the function clock domains after being grouped into the plurality of scan clock domains according to the clock domain report file and the user configuration file, wherein the circuit netlist file includes a plurality of function clock domains, and the timing constraint file may include the information of frequency, phase, and the false path definitions of the plurality of function clock domains. Furthermore, the circuit netlist file includes a plurality of flip flops, wherein each flip flop is controlled by a corresponding function clock; each flip flop belongs to one of the plurality of function clock domains, and using the information of the timing constraint file can correlate the plurality of flip flops in the circuit netlist file to the plurality of function clock domains respectively.

In addition, the amount of crossing paths between at least one scan clock domain and another scan clock domain is recorded in the clock domain report file; the clock domain report file further includes information of whether any crossing path belongs to a true path or a false path, or includes the amount of flip flops in any function clock domain. The user configuration file includes at least one of settings of a scan clock domain allocation algorithm and settings of the amount of a scan clock domain. The settings of a scan clock domain allocation algorithm is used for further detailed settings and adjustments for the scan clock domain allocation algorithm according to different applications or requests, and the settings of the amount of the scan clock domain is according to the actual state, such as the chip size, the amount of pins, or the automatic testing equipment pin limitation.

The disclosed embodiments of the present invention utilize the crossing paths between function clock domains to perform scan clock domain allocation for grouping a plurality of function clock domains together and allocating the grouped function clock domains into limited scan clock domains, thus reaching the goal of simplifying complicated flow of the back-end design for test procedures and reducing the cost of chip development.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for determining a scan clock domain allocation of an integrated circuit, comprising:
    utilizing a circuit netlist file and a timing constraints file of the integrated circuit to find out an amount of crossing paths between two function clock domains of a plurality of function clock domains and generate a clock domain report file; and
    grouping the plurality of function clock domains and allocating the plurality of function clock domains by a processor after being grouped into a plurality of scan clock domains according to the clock domain report file;
    wherein the amount of the plurality of scan clock domains is less than the amount of the plurality of function clock domains, and the integrated circuit is tested according to the allocated function clock domains.

2. The method of claim 1, wherein the step of grouping the plurality of function clock domains and allocating the plurality of function clock domains after being grouped into the plurality of the scan clock domains comprises:
    receiving a user configuration file; and
    grouping the plurality of function clock domains of the integrated circuit and allocating the plurality of function clock domains after being grouped into the plurality of scan clock domains according to the clock domain report file and the user configuration file.

3. The method of claim 1, wherein the step of grouping the plurality of function clock domains and allocating the plurality of function clock domains after being grouped into the plurality of scan clock domains comprises:
    allocating the two function clock domains to a same scan clock domain when the amount of crossing paths between the two function clock domains is less than a specific number.

4. The method of claim 1, wherein the step of grouping the plurality of function clock domains and allocating the plurality of function clock domains after being grouped into the plurality of scan clock domains comprises:
    allocating the two function clock domains to different scan clock domains respectively when the two function clock domains are asynchronous and the amount of crossing paths between the two function clock domains is greater than a specific number.

5. The method of claim 1, wherein the step of grouping the plurality of function clock domains and allocating the plurality of the function clock domains after being grouped into the plurality of scan clock domains comprises:

allocating the two function clock domains to different scan clock domains respectively when the two function clock domains are synchronous and the amount of false paths among the crossing paths between the two function clock domains is greater than a specific number.

6. The method of claim 1, wherein the step of generating a clock domain report file comprises:

utilizing the circuit netlist file and the timing constraints file of the integrated circuit to find out the amount of crossing paths between the two function clock domains and the amount of flip flops among each function clock domain of the integrated circuit, to generate a clock domain report file.

7. The method of claim 1, wherein the step of grouping the plurality of function clock domains and allocating the plurality of function clock domains after being grouped into the plurality of scan clock domains comprises:

allocating a plurality of specific function clock domains to a different specific scan clock domain according to the amount of crossing paths between the two function clock domains; and checking whether the amount of flip flops among the specific scan clock domain exceeds a specific number.

8. A non-transitory machine readable media, storing a program code, wherein when executed by a processor, the program code enables the processor to perform the following steps:

utilizing a circuit netlist file and a timing constraints file of an integrated circuit to find out the amount of crossing paths between two function clock domains and generate a clock domain report file; and grouping the plurality of function clock domains and allocating the plurality of function clock domains after being grouped into a plurality of scan clock domains according to the clock domain report file;

wherein the amount of the plurality of scan clock domains is less than the amount of the plurality of function clock domains, and the integrated circuit is tested according to the allocated function clock domains.

9. The non-transitory machine readable media of claim 8, wherein the step of grouping the plurality of function clock domains and allocating the plurality of function clock domains after being grouped into the plurality of scan clock domains comprises:

allocating the two function clock domains to a same scan clock domain when the amount of crossing paths between the two function clock domains is less than a specific number.

10. The non-transitory machine readable media of claim 8, wherein the step of grouping the plurality of function clock domains and allocating the plurality of function clock domains after being grouped into the plurality of scan clock domains comprises:

allocating the two function clock domains to different scan clock domains respectively when the two function clock domains are asynchronous and the amount of crossing paths between the two function clock domains is greater than a specific number.

11. The non-transitory machine readable media of claim 8, wherein the step of grouping the plurality of function clock domains and allocating the plurality of function clock domains after being grouped into the plurality of scan clock domains comprises:

allocating the two function clock domains to different scan clock domains respectively when the two function clock domains are synchronous and the amount of false paths among the crossing paths between the two function clock domains is greater than a specific number.

12. The non-transitory machine readable media of claim 8, wherein the step of generating a clock domain report file comprises:

utilizing the circuit netlist file and the timing constraints file of the integrated circuit to find out the amount of crossing paths between the two function clock domains and the amount of flip flops among each function clock domain of the integrated circuit, to generate a clock domain report file.

13. The non-transitory machine readable media of claim 8, wherein the step of grouping the plurality of function clock domains and allocating the plurality of function clock domains after being grouped into the plurality of scan clock domains comprises:

allocating a plurality of specific function clock domains to a different specific scan clock domain according to the amount of crossing paths between any the two function clock domains; and checking whether the amount of flip flops among the specific scan clock domain exceeds a specific number.

\* \* \* \* \*